(12) United States Patent
Volkovich et al.

(10) Patent No.: US 12,347,706 B2
(45) Date of Patent: Jul. 1, 2025

(54) METHOD FOR MEASURING AND CORRECTING MISREGISTRATION BETWEEN LAYERS IN A SEMICONDUCTOR DEVICE, AND MISREGISTRATION TARGETS USEFUL THEREIN

(71) Applicant: KLA-TENCOR CORPORATION, Milpitas, CA (US)

(72) Inventors: Roie Volkovich, Migdal Ha'emek (IL); Renan Milo, Rishon Lezion (IL); Liran Yerushalmi, Zicron Yaacob (IL); Moran Zaberchik, Ahuzat Barak (IL); Yoel Feler, Haifa (IL); David Izraeli, Haifa (IL)

(73) Assignee: KLA-TENCOR CORPORATION, Milpitas, CA (US)

(*) Notice: Subject to any disclaimer, the term of this patent is extended or adjusted under 35 U.S.C. 154(b) by 491 days.

(21) Appl. No.: 17/688,856

(22) Filed: Mar. 7, 2022

(65) Prior Publication Data

US 2022/0199437 A1    Jun. 23, 2022

Related U.S. Application Data

(63) Continuation of application No. 16/467,968, filed as application No. PCT/US2019/030776 on May 6, 2019, now Pat. No. 11,302,544.
(Continued)

(51) Int. Cl.
 *G05B 19/418* (2006.01)
 *H01L 21/67* (2006.01)

(52) U.S. Cl.
 CPC .. *H01L 21/67276* (2013.01); *G05B 19/41875* (2013.01); *G05B 2219/32368* (2013.01)

(58) Field of Classification Search
 CPC ... H01L 21/67276; H01L 22/20; H01L 22/30; H01L 22/12; G05B 19/41875; G05B 2219/32368; G03F 7/70633
 See application file for complete search history.

(56) References Cited

U.S. PATENT DOCUMENTS 5,699,282 A  12/1997  Allen et al.
6,774,998 B1  8/2004  Wright et al.
(Continued)

FOREIGN PATENT DOCUMENTS

CN  105308508 A  2/2016
CN  109313392 A  2/2019
(Continued)

OTHER PUBLICATIONS

EPO, Extended European Search Report for EP Application No. 19921663.1, Jan. 16, 2023.
(Continued)

*Primary Examiner* — Yuhui R Pan
(74) *Attorney, Agent, or Firm* — Hodgson Russ LLP

(57) ABSTRACT

A method for measurement of misregistration in the manufacture of semiconductor device wafers, the method including measuring misregistration between layers of a semiconductor device wafer at a first instance and providing a first misregistration indication, measuring misregistration between layers of a semiconductor device wafer at a second instance and providing a second misregistration indication, providing a misregistration measurement difference output in response to a difference between the first misregistration indication and the second misregistration indication, providing a baseline difference output and ameliorating the difference between the misregistration measurement difference output and the baseline difference output.

14 Claims, 13 Drawing Sheets

Related U.S. Application Data

(60) Provisional application No. 62/825,262, filed on Mar. 28, 2019.

(56) References Cited

U.S. PATENT DOCUMENTS

| | | | |
|---|---|---|---|
| 9,786,596 | B2 | 10/2017 | Adusumilli et al. |
| 2003/0002043 | A1 | 1/2003 | Abdulhalim et al. |
| 2006/0039595 | A1 | 2/2006 | Adel et al. |
| 2010/0005442 | A1* | 1/2010 | Ghinovker ............. G06F 30/39 716/55 |
| 2016/0061589 | A1* | 3/2016 | Bhattacharyya .... G03F 7/70683 356/620 |
| 2018/0100735 | A1 | 4/2018 | Abdulhalim et al. |
| 2018/0129139 | A1 | 5/2018 | Jiang et al. |
| 2018/0253017 | A1 | 9/2018 | Adel et al. |
| 2018/0275530 | A1 | 9/2018 | Kandel et al. |

FOREIGN PATENT DOCUMENTS

| | | |
|---|---|---|
| EP | 3330797 A1 | 6/2018 |
| JP | 2003163163 | 6/2003 |
| JP | 2004363313 A | 12/2004 |
| JP | 2005181636 | 7/2005 |
| JP | 2007527531 A | 9/2007 |
| JP | 2009014830 | 1/2009 |
| JP | 2018522283 | 8/2018 |
| TW | 201618206 A | 5/2016 |
| TW | 201705212 A | 2/2017 |
| TW | 201734246 A | 10/2017 |
| TW | 201840993 A | 11/2018 |
| WO | 2002084213 A1 | 10/2002 |
| WO | 03071471 A1 | 8/2003 |
| WO | 2016030255 A2 | 3/2016 |
| WO | 2018099690 A1 | 6/2018 |

OTHER PUBLICATIONS

JPO, Office Action issued for JP Application No. 2023-119592, Jan. 30, 2024.

JPO, Office Action for JP Application No. 2021-576144, Apr. 25, 2023.

CNIPA, Office Action issued in CN Application No. 201980096802.8, Jun. 22, 2024.

TIPO, Office Action issued in TW Application No. 109103938, Sep. 8, 2023.

* cited by examiner

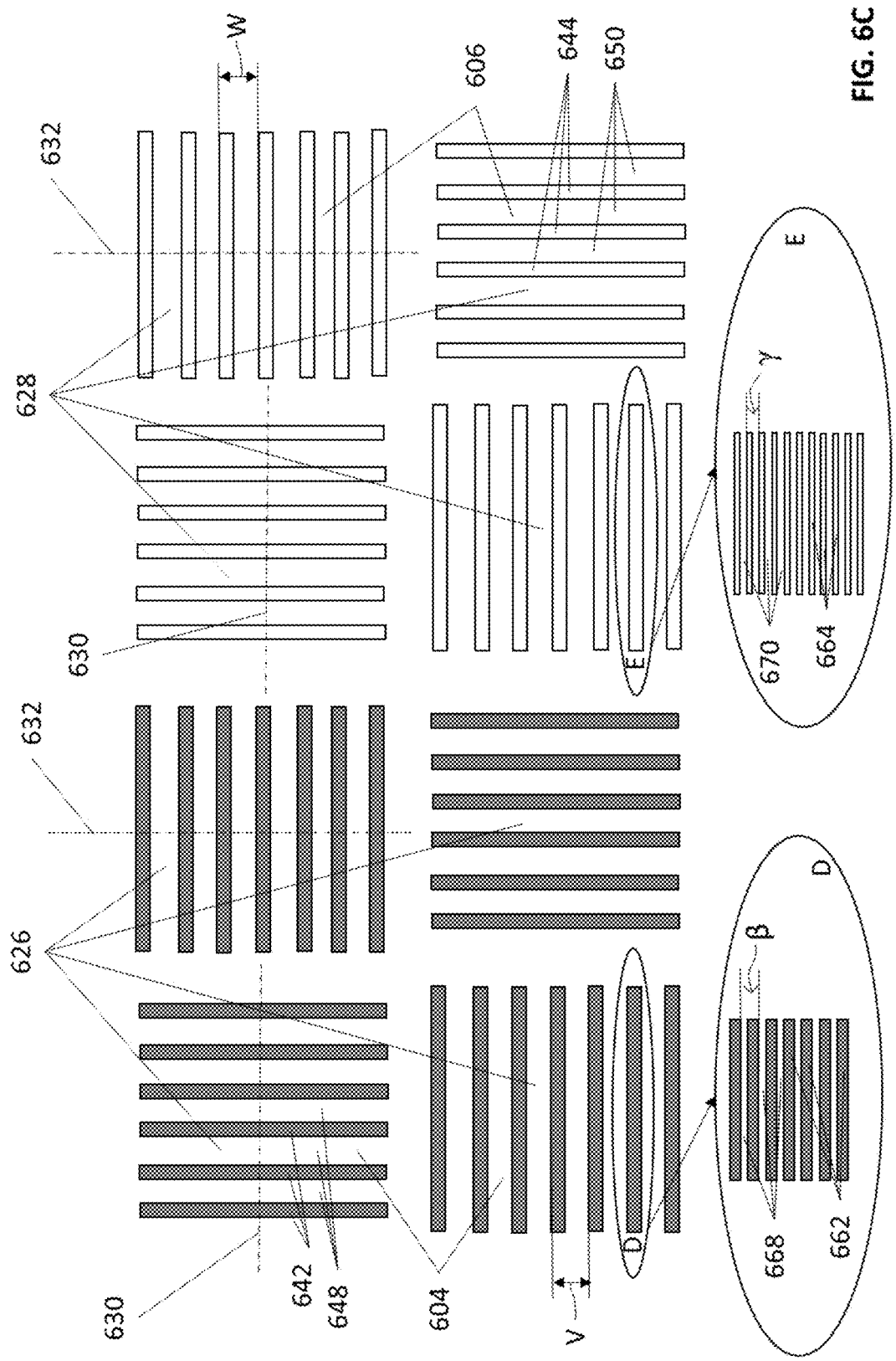

METHOD FOR MEASURING AND CORRECTING MISREGISTRATION BETWEEN LAYERS IN A SEMICONDUCTOR DEVICE, AND MISREGISTRATION TARGETS USEFUL THEREIN

REFERENCE TO RELATED APPLICATIONS

This application is a continuation of U.S. application Ser. No. 16/467,968 filed Jun. 8, 2019, which is a national stage application of PCT/US19/30776 filed May 6, 2019, which claims priority to the provisional patent application U.S. App. No. 62/825,262 filed Mar. 28, 2019, the disclosures of which are hereby incorporated by reference.

FIELD OF THE INVENTION

The present invention relates to the field of metrology, and more particularly, to misregistration metrology procedures.

BACKGROUND OF THE INVENTION

Various types of devices for metrology and misregistration metrology procedures are known.

SUMMARY OF THE INVENTION

The present invention seeks to provide an improved method for measurement of misregistration in the manufacture of semiconductor device wafers and amelioration thereof.

There is thus provided in accordance with a preferred embodiment of the present invention a method for measurement of misregistration in the manufacture of semiconductor device wafers, the method including measuring misregistration between layers of a semiconductor device wafer at a first instance and providing a first misregistration indication, measuring misregistration between layers of a semiconductor device wafer at a second instance and providing a second misregistration indication, providing a misregistration measurement difference output in response to a difference between the first misregistration indication and the second misregistration indication, providing a baseline difference output and ameliorating the difference between the misregistration measurement difference output and the baseline difference output.

Preferably, the ameliorating includes at least one of changing misregistration metrology and changing at least one process step in the manufacture of semiconductor device wafers.

In accordance with a preferred embodiment of the present invention the method for measurement of misregistration in the manufacture of semiconductor device wafers also includes comparing the difference between the misregistration measurement difference output and the baseline difference output with a threshold and the ameliorating occurs when the difference between the misregistration measurement difference output and the baseline difference output exceeds the threshold. Additionally or alternatively, the baseline difference output represents a calculated compilation of differences between the first misregistration indication and second misregistration indication.

In accordance with a preferred embodiment of the present invention the first and second instances include different stages in a manufacturing process of a single batch of semiconductor device wafers intended to be identical from which the semiconductor device wafer is selected.

In accordance with a preferred embodiment of the present invention, the same semiconductor device wafer is measured at the first and second instances. Alternatively, different semiconductor device wafers, which are selected from the single batch of semiconductor devices intended to be identical, are measured at the first and second instances.

Preferably, the first and second instances include different regions of a single target on the semiconductor device wafer.

In accordance with a preferred embodiment of the present invention the misregistration measurement difference output includes an indication of metrology quality.

In accordance with a preferred embodiment of the present invention the misregistration measurement difference output includes an indication of quality of at least one of the different stages.

Preferably, the method also includes using at least one of the first and second misregistration measurement indications to ameliorate misregistration measurement between layers of a semiconductor device at a third instance. Additionally, the third instance includes a later stage in the manufacturing process of the semiconductor device.

In accordance with a preferred embodiment of the present invention the method also includes using the misregistration measurement difference output to ameliorate parameters of the manufacturing process of the single batch of semiconductor devices intended to be identical from which the semiconductor device wafer is selected.

There is also provided in accordance with a preferred embodiment of the present invention a target for use in the measurement of misregistration in the manufacture of semiconductor device wafers and in the calibration of the measurements of misregistration, the target including at least a first structure arranged on a first layer of a semiconductor device wafer and at least a second and a third different structures arranged on a second layer of the semiconductor device.

Preferably, the second and third different structures are formed simultaneously, using identical fabrication tools and methods. Additionally or alternatively, at least one of the first, second and third structures is defined by a plurality of sub-lines and sub-spaces between the sub-lines, the sub-lines being characterized by a pitch.

In accordance with a preferred embodiment of the present invention the second structure is defined by a plurality of second structure sub-lines and a plurality of second structure sub-spaces having a second structure pitch, the third structure is defined by a plurality of third structure sub-lines and a plurality of third structure sub-spaces having a third structure pitch and the second structure pitch and the third structure pitch are different from one another.

In accordance with a preferred embodiment of the present invention the target is characterized by rotational symmetry. Additionally or alternatively, the first, second and third structures are periodic structures.

Preferably, the second and third structures overly the first periodic structure.

In accordance with a preferred embodiment of the present invention the first, second and third structures are bars. Alternatively, the first, second and third structures are rectangular boxes.

In accordance with a preferred embodiment of the present invention the target also includes at least a fourth structure and the first, second, third and fourth structures are characterized by rotational symmetry.

BRIEF DESCRIPTION OF THE DRAWINGS

The present invention will be understood and appreciated more fully from the following detailed description, taken in conjunction with the drawings in which:

FIGS. 6A, 6B and 6C are simplified illustrations of yet another embodiment of the method of FIG. 1 showing multiple instances of measurement of misregistration between two layers of a semiconductor device wafer using different areas of a fourth target;

DETAILED DESCRIPTION OF PREFERRED EMBODIMENTS

Figure 1:
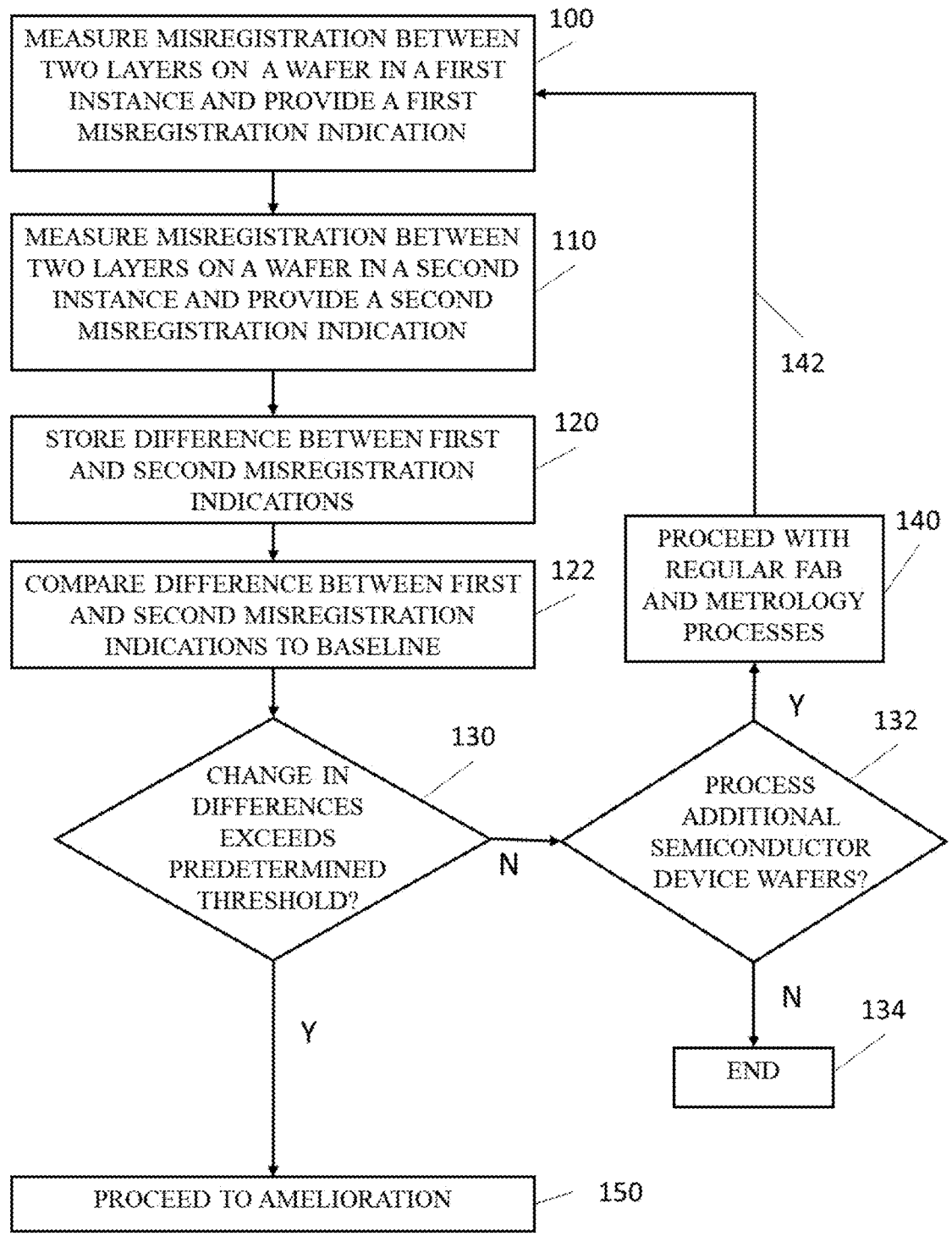
FIG. 1 is a simplified flowchart illustrating a method of measuring misregistration between layers of a semiconductor device in accordance with a preferred embodiment of the present invention.

Reference is now made to FIG. 1, which is a simplified flowchart illustrating a method of measuring misregistration between layers of a semiconductor device wafer in accordance with a preferred embodiment of the present invention, and to FIGS. 2-7, which are illustrations of various embodiments of the method. It is appreciated that method illustrated in FIG. 1 is useful in the manufacture of semiconductor devices.

As seen in FIG. 1, at a first step 100, misregistration is measured at a first instance between two layers of a semiconductor device wafer selected from a batch of semiconductor device wafers, which are intended to be identical (BSDWII) 102. A first misregistration indication is provided.

Thereafter, at a next step 110, misregistration is measured at a second instance between two layers of a semiconductor device wafer and a second misregistration indication is provided.

It is appreciated that the semiconductor device wafer whose misregistration is measured in steps 100 and 110 may be identical. Alternatively, the semiconductor device wafer measured in the second instance may be a different wafer selected from the same BSDWII 102 from which the semiconductor device wafer measured in the first instance was selected.

It is further appreciated that the first and second layers of semiconductor device wafer whose misregistration is measured in steps 100 and 110 may be identical. Alternatively, at least one of the first and second layers of semiconductor device wafer measured in the second instance may be different from the first and second layers of the semiconductor device wafer measured in the first instance.

It is yet further appreciated that misregistration measurements in steps 100 and 110 may be measured either with identical measurement parameters or with different measurement parameters.

As seen at a next step 120, the difference between the misregistration measured in the first instance and the misregistration measured in the second instance is stored, and at a following step 122, a misregistration measurement difference output is generated by comparing the stored difference to a baseline difference output. In a preferred embodiment of the present invention, the baseline difference output represents a calculated compilation of differences between the first and second misregistration indications, such as an average or a mean. In a preferred embodiment of the present invention, such a calculated compilation of differences between first and second misregistration indications is obtained from first and second misregistration indications measured on previously processed semiconductor device wafers, which are selected from BSDWII 102.

At a subsequent step 130, the misregistration measurement difference output, in the form of the difference between the difference between the misregistration measured in the first instance and the misregistration measured in the second instance stored at step 120 and the baseline difference output used at step 122, is compared with a predetermined threshold.

As indicated at a subsequent step 132, if the misregistration measurement difference output of step 130 does not exceed the predetermined threshold, the method continues by checking if there are additional semiconductor device wafers to be processed, the method ends at a step 134. If additional semiconductor device wafers are to be processed, the method continues to a next step 140, whereat the regular fabrication and metrology proceeds for the next semiconductor wafer or wafers in BSDWII 102. As indicated by an arrow 142, the regular fabrication and metrology process includes repetitions of steps 100, 110, 120, 122 and 130.

As indicated at a subsequent step 150, if the misregistration measurement difference output exceeds the predetermined threshold, amelioration of either or both the wafer fabrication and the metrology takes place.

Figure 2:
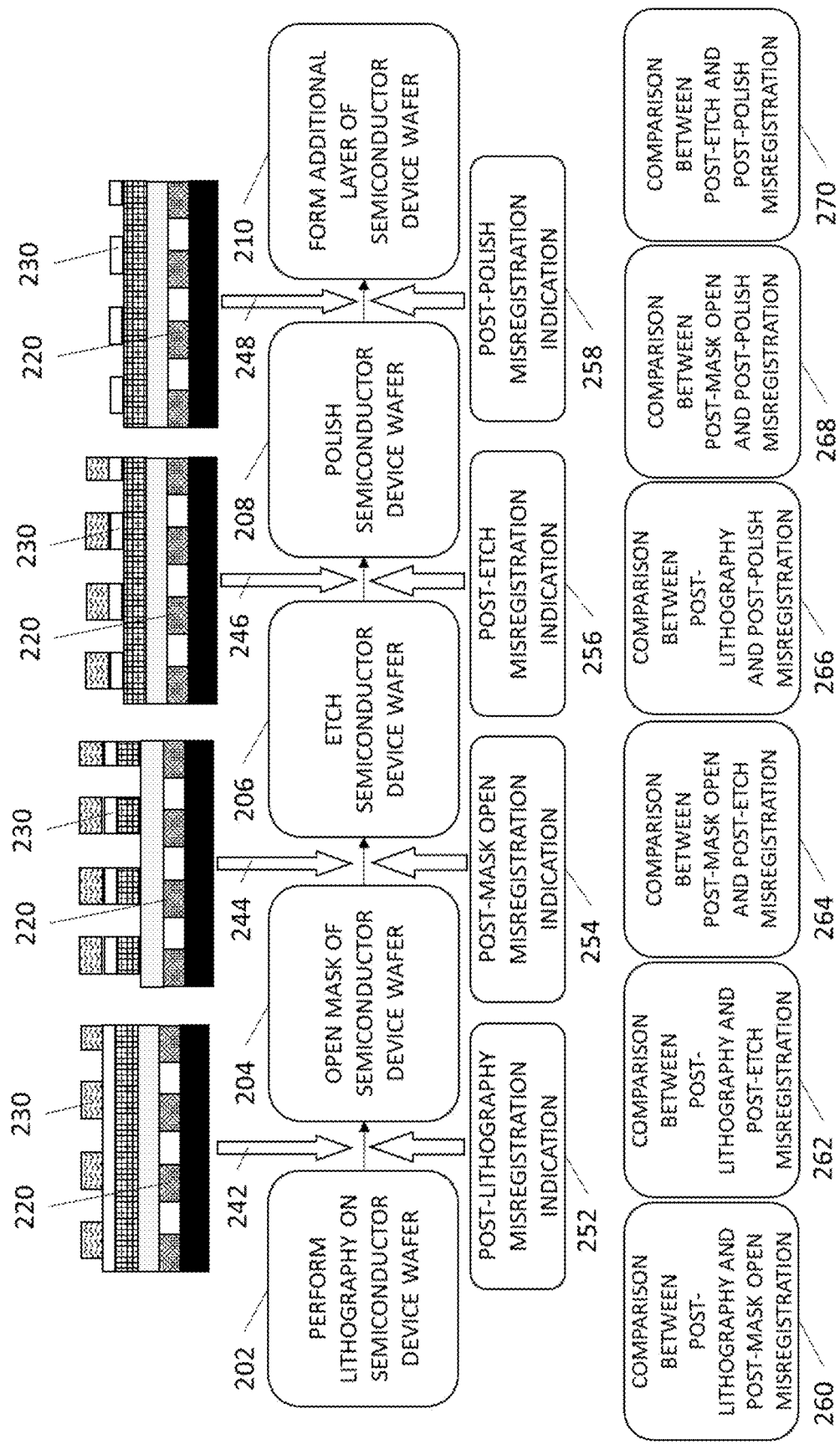
FIG. 2 is a simplified illustration of an embodiment of the method of FIG. 1 showing multiple instances of measurement of misregistration between two layers of a semiconductor device wafer at different stages in a semiconductor manufacturing process.

FIG. 2 illustrates five typical process stages in wafer fabrication indicated by reference numerals 202, 204, 206, 208 and 210. These stages are identified as follows: lithography 202, mask opening 204, etching 206, polishing 208 and forming additional layer 210. It is appreciated that not all of steps 202, 204, 206, 208 and 210 need be performed. For example, typically only one of steps mask opening 204 and etching 206 are performed on a given semiconductor device wafer. It is further appreciated that other steps may also be performed before, between, or after steps 202, 204, 206, 208 and 210.

FIG. 2 also illustrates in a simplified manner, the first and second layers 220 and 230 of a portion of a typical semiconductor wafer precursor at four intermediate stages, indicated respectively by arrows 242, 244, 246 and 248, each of which is intermediate a pair of respective process stages 202 & 204, 204 & 206, 206 & 208 and 208 & 210.

It is a particular feature of an embodiment of the present invention that the first and second instances referenced in the above description of FIG. 1 may be any two of the intermediate stages 242, 244, 246 and 248, respectively. Correspondingly, the first and second misregistration indications referenced in the above description of FIG. 1 may be any two of the misregistration indications: post-lithography misregistration indication 252, post-mask open misregistration indication 254, post-etch misregistration indication 256 and post-polish misregistration indication 258, corresponding to the intermediate stages 242, 244, 246 and 248, respectively.

A plurality of compilations of differences between the misregistration indications 252, 254, 256 and 258 may be made in accordance with steps 120 and 130 described above with reference to FIG. 1. These compilations of differences including the following: comparison between post-lithography and post-mask open misregistration, comparison between post-lithography and post-etch misregistration, comparison between post-mask open and post-etch misregistration, comparison between post-lithography and post-polish misregistration, comparison between post-mask open and post-polish misregistration and comparison between post-etch and post-polish misregistration, are indicated by respective reference numerals 260, 262, 264, 266, 268 and 270. Each of these compilations may be compared with an appropriate threshold, as described hereinabove with reference to FIG. 1.

It is appreciated that any of misregistration indications 252, 254, 256 and 258 may be used to optimize misregistration measurement between layers of a semiconductor device in a later stage in the manufacturing process of BSDWII 102.

Figure 3:
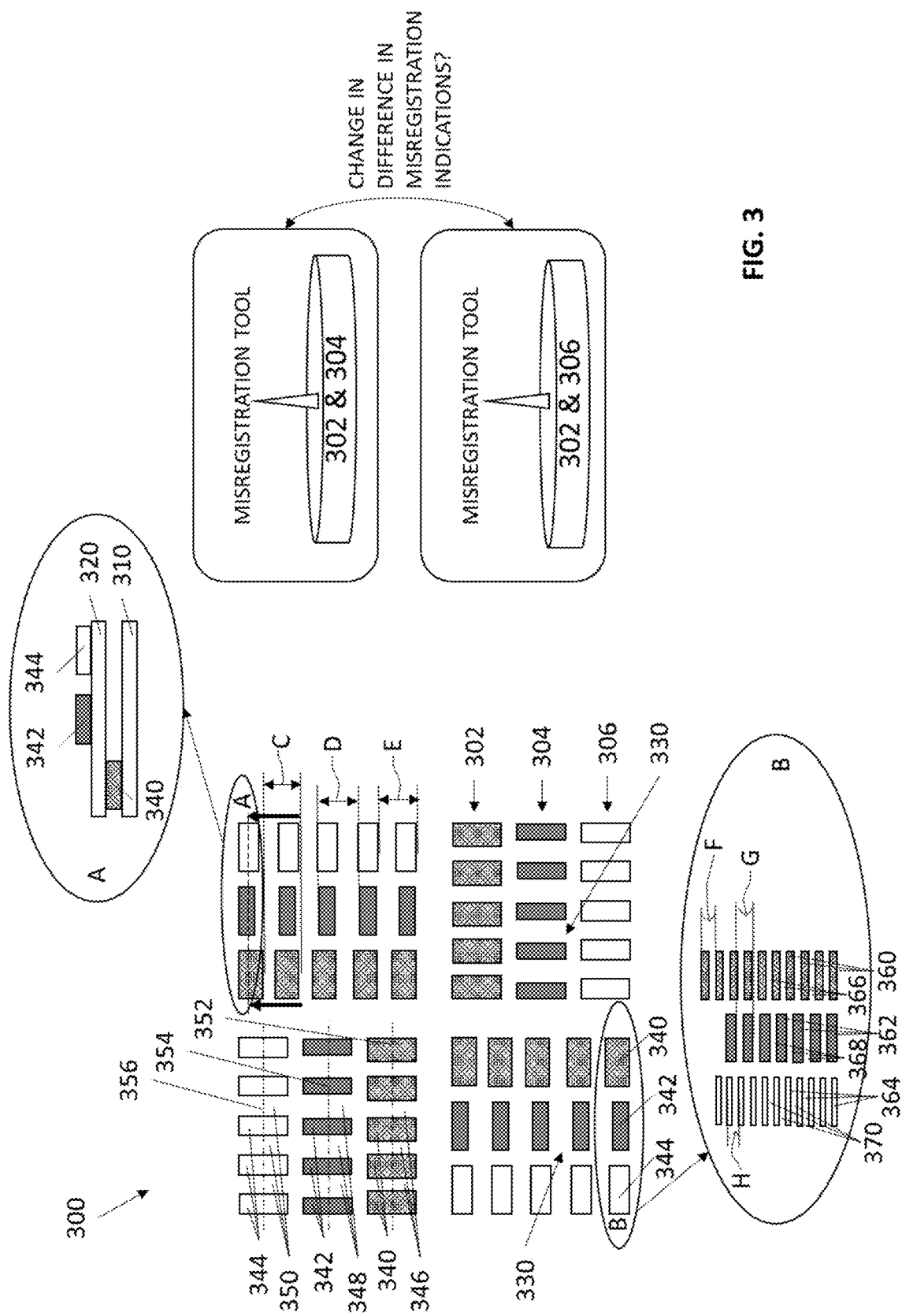
FIG. 3 is a simplified illustration of an embodiment of the method of FIG. 1 showing multiple instances of measurement of misregistration between two layers of a semiconductor device wafer using different areas of a target.

FIG. 3 illustrates a target 300 preferably having three periodic structures 302, 304 and 306. As seen particularly in sectional enlargement A of FIG. 3, it is a particular feature of the present invention that periodic structure 302 is formed on a first layer 310 of a semiconductor device wafer and periodic structures 304 and 306 are both formed on a second layer 320 of the semiconductor device wafer. It is a particular feature of an embodiment of the present invention that periodic structures 304 and 306 are formed simultaneously, using identical fabrication tools and methods. It is appreciated that first and second layers 310 and 320 may be adjacent but need not be.

It is noted that target 300 preferably includes four sets 330 of periodic structures 302, 304 and 306. Each of sets 330 appears in target 300 in a different mutually orthogonal orientation, giving target 300 rotational symmetry. It is appreciated that other than their orientation, each of sets 330 of periodic structures 302, 304 and 306 are preferably identical to each other.

In a preferred embodiment of the present invention, periodic structures 302, 304 and 306 are each defined by a plurality of mutually parallel lines 340, 342 and 344, respectively, and mutually parallel spaces 346, 348 and 350 between respective mutually parallel lines 340, 342 and 346. Mutually parallel lines and spaces 340 & 346, 342 & 348 and 344 & 350 are arranged along axes 352, 354 and 356, respectively.

Preferably, lines 340, 342 and 346 have respective pitches C, D and E, each in the range of 1-3 μm and line widths which are 10%-90% of each respective pitch C, D or E, most typically 50% of C, D or E.

Lines 340, 342 and 346 are typically segmented, though they need not be. In an embodiment wherein lines 340, 342 and 346 are segmented, as seen in enlargement B of FIG. 3, each one of lines 340, 342 and 346 is defined by a plurality of respective sub-lines 360, 362 and 364 and respective sub-spaces 366, 368 and 370 between sub-lines 360, 362 and 364. Preferably, sub-lines 360, 362 and 364 have respective segmentation pitches F, G and H, each in the range of 10-200 nm.

Periodic structures 302, 304 and 306 may be distinguished from one another by any of their respective pitches C, D and E, their respective line widths and their segmentation pitches F, G and H, and most preferably by their segmentation pitches F, G and H.

It is a particular feature of an embodiment of the present invention that the first and second instances referenced in the above discussion of FIG. 1 may be misregistration measurements taken using periodic structures 302 & 304 or periodic structures 302 & 306. Correspondingly, the first and second misregistration indications referenced in the above discussion of FIG. 1 may be the misregistration indications obtained from each of the misregistration measurements taken using periodic structures 302 & 304 or periodic structures 302 & 306.

It is appreciated that since periodic structures 304 and 306 are preferably formed together, any difference in misregistration indications between periodic structures 302 & 304 and 302 & 306 over a predetermined threshold indicates a need for amelioration in the misregistration metrology process.

Figure 4:
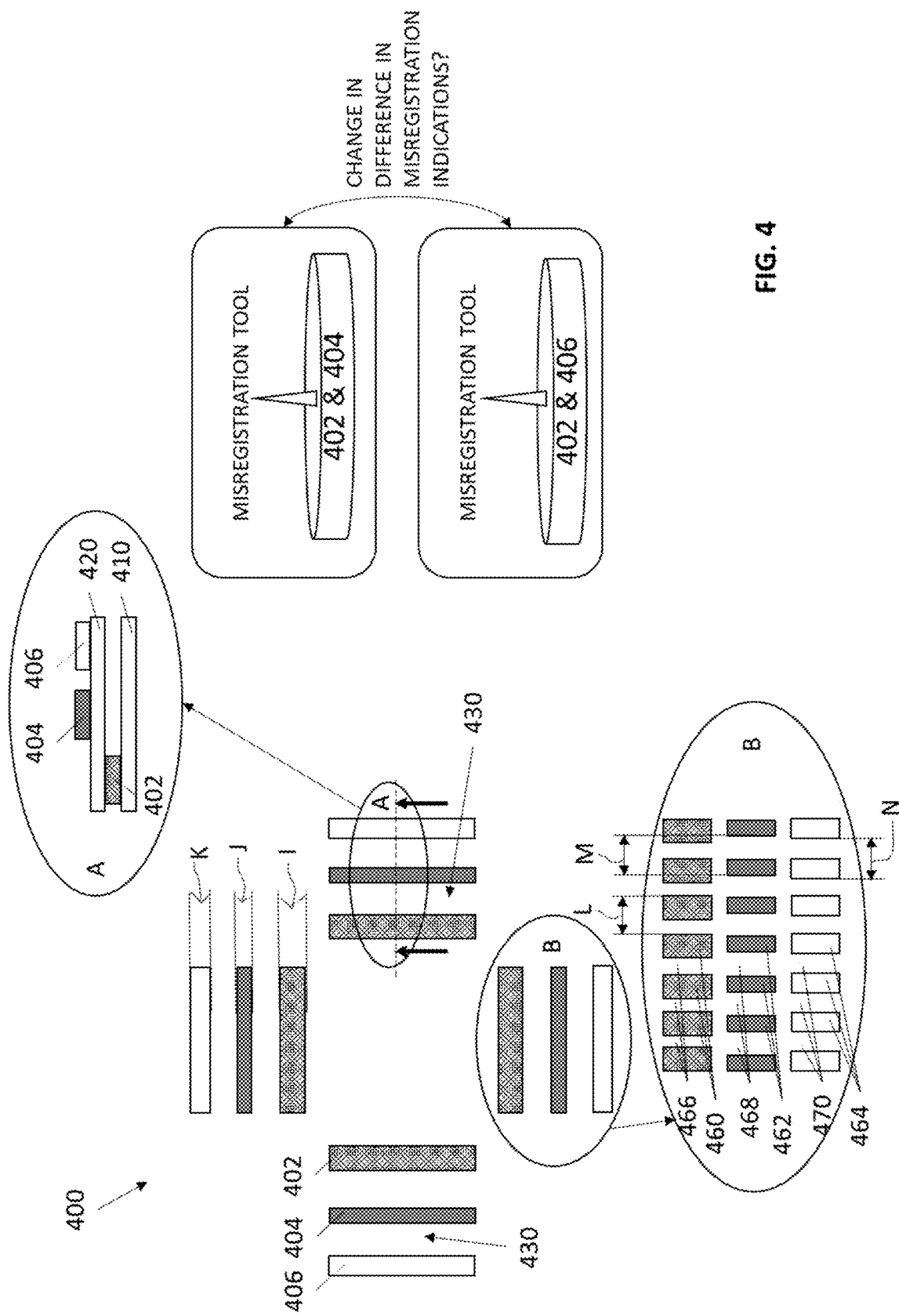
FIG. 4 is a simplified illustration of an embodiment of the method of FIG. 1 showing multiple instances of measurement of misregistration between two layers of a semiconductor device wafer using different areas of a second target.

FIG. 4 illustrates a target 400 preferably having three structures 402, 404 and 406. As seen particularly in sectional enlargement A of FIG. 4, it is a particular feature of the present invention that structure 402 is formed on a first layer 410 of a semiconductor device wafer and structures 404 and 406 are both formed on a second layer 420 of the semiconductor device wafer. It is a particular feature of an embodiment of the present invention that structures 404 and 406 are formed simultaneously, using identical fabrication tools and methods. It is appreciated that first and second layers 410 and 420 may be adjacent but need not be.

It is noted that target 400 preferably includes four sets 430 of structures 402, 404 and 406. Each of sets 430 appears in target 400 in a different mutually orthogonal orientation, giving target 400 rotational symmetry. It is appreciated that other than their orientation, each of sets 430 of structures 402, 404 and 406 are preferably identical to each other. In a preferred embodiment of the present invention, structures 402, 404, and 406 are bars.

Preferably, structures 402, 404 and 406 have respective widths I, J and K, each in the range of 0.5-1.5 μm. Structures 402, 404 and 406 are typically segmented, though they need not be. In an embodiment wherein structures 402, 404 and 406 are segmented, as seen in enlargement B of FIG. 4, each one of structures 402, 404 and 406 is defined by a plurality of respective sub-lines 460, 462 and 464 and respective sub-spaces 466, 468 and 470 between sub-lines 460, 462 and 464. Preferably, sub-lines 460, 462 and 464 have respective segmentation pitches L, M and N, each in the range of 10-200 nm.

Structures 402, 404 and 406 may be distinguished from one another by any of their respective widths I, J and K and their segmentation pitches L, M and N, and most preferably by their segmentation pitches L, M and N.

It is a particular feature of an embodiment of the present invention that the first and second instances referenced in the above discussion of FIG. 1 may be misregistration measurements taken using structures 402 & 404 or structures 402 & 406. Correspondingly, the first and second misregistration indications referenced in the above discussion of FIG. 1 may be the misregistration indications obtained from each of the misregistration measurements taken using structures 402 & 404 or structures 402 & 406.

It is appreciated that since structures 404 and 406 are preferably formed together, any difference in misregistration indications between structures 402 & 404 and 402 & 406 over a predetermined threshold indicates a need for amelioration in the misregistration metrology process.

Figure 5:
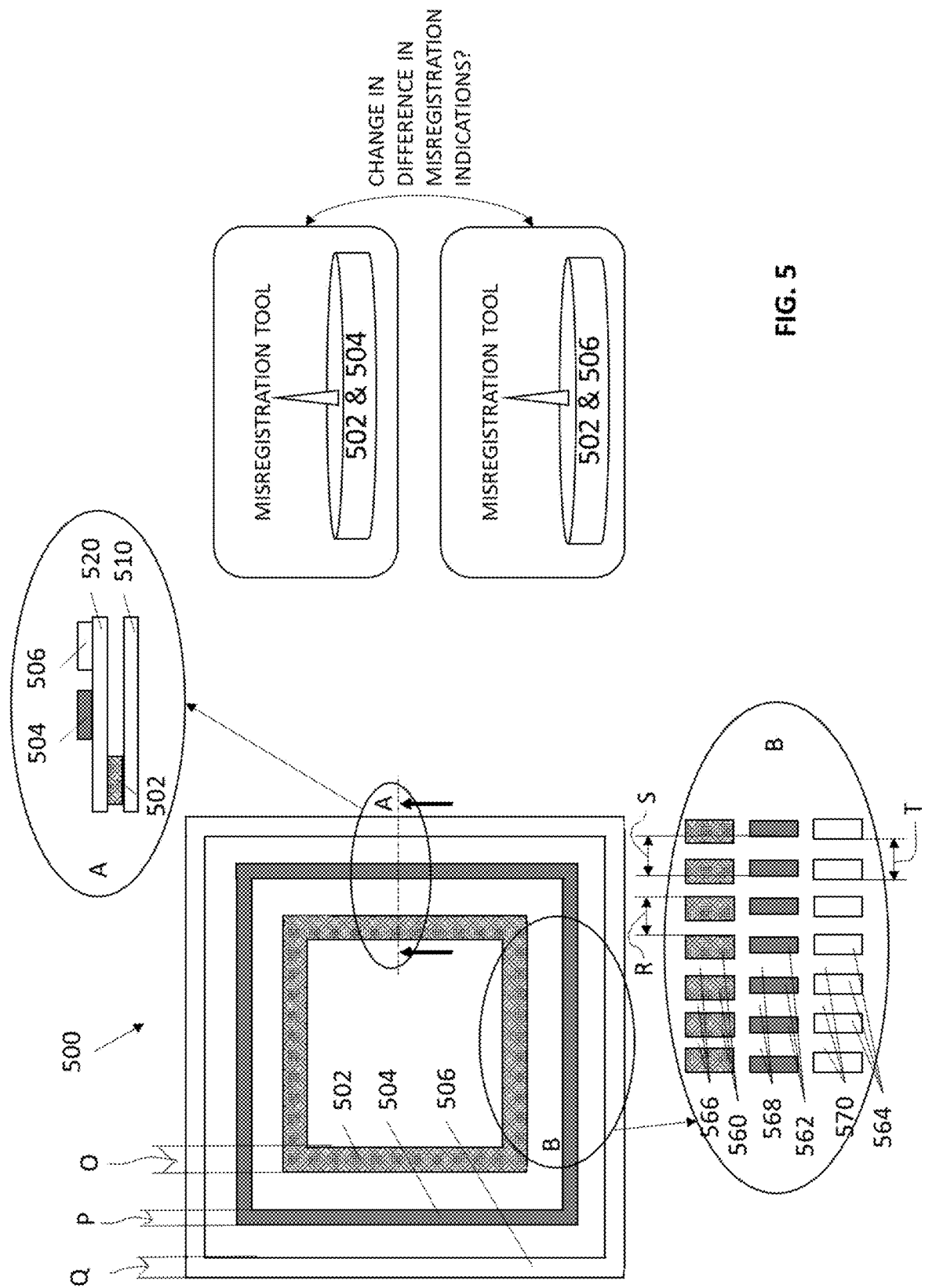
FIG. 5 is a simplified illustration of an embodiment of the method of FIG. 1 showing multiple instances of measurement of misregistration between two layers of a semiconductor device wafer using different areas of a third target.

FIG. 5 illustrates a target 500 preferably having three structures 502, 504 and 506. As seen particularly in sectional enlargement A of FIG. 5, it is a particular feature of the present invention that structure 502 is formed on a first layer 510 of a semiconductor device wafer and structures 504 and 506 are both formed on a second layer 520 of the semiconductor device wafer. It is a particular feature of an embodiment of the present invention that structures 504 and 506 are formed simultaneously, using identical fabrication tools and methods. It is appreciated that first and second layers 510 and 520 may be adjacent but need not be. It is noted that each of structures 502, 504 and 506 is characterized by rotational symmetry, giving target 500 rotational symmetry. In a preferred embodiment of the present invention, structures 502, 504, and 506 are boxes, preferably rectangular or square boxes.

Preferably, structures 502, 504 and 506 have respective widths O, P and Q, each in the range of 0.5-1.5 μm. Structures 502, 504 and 506 are typically segmented, though they need not be. In an embodiment wherein structures 502, 504 and 506 are segmented, as seen in enlargement B of FIG. 5, each one of structures 502, 504 and 506 is defined by a plurality of respective sub-lines 560, 562 and 564 and respective sub-spaces 566, 568 and 570 between sub-lines 560, 562 and 564. Preferably, sub-lines 560, 562 and 564 have respective segmentation pitches R, S and T, each in the range of 10-200 nm.

Structures 502, 504 and 506 may be distinguished from one another by any of their respective widths O, P and Q and their segmentation pitches R, S and T, and most preferably by their segmentation pitches R, S and T.

It is a particular feature of an embodiment of the present invention that the first and second instances referenced in the above discussion of FIG. 1 may be misregistration measurements taken using structures 502 & 504 or structures 502 & 506. Correspondingly, the first and second misregistration indications referenced in the above discussion of FIG. 1 may be the misregistration indications obtained from each of the misregistration measurements taken using structures 502 & 504 or structures 502 & 506.

It is appreciated that since structures 504 and 506 are preferably formed together, any difference in misregistration indications between structures 502 & 504 and 502 & 506 over a predetermined threshold indicates a need for amelioration in the misregistration metrology process.

Figure 6A:
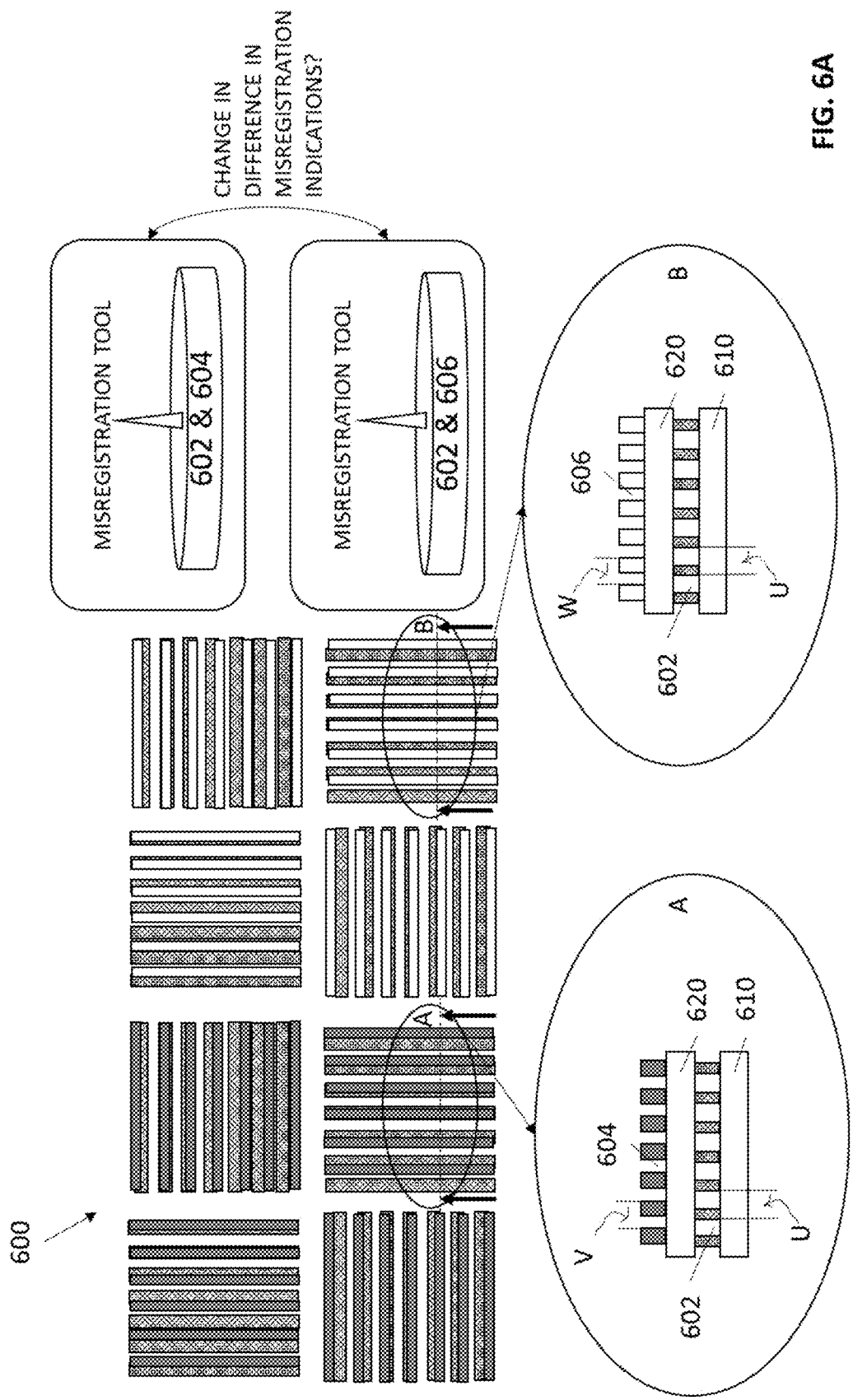
Figure 6B:
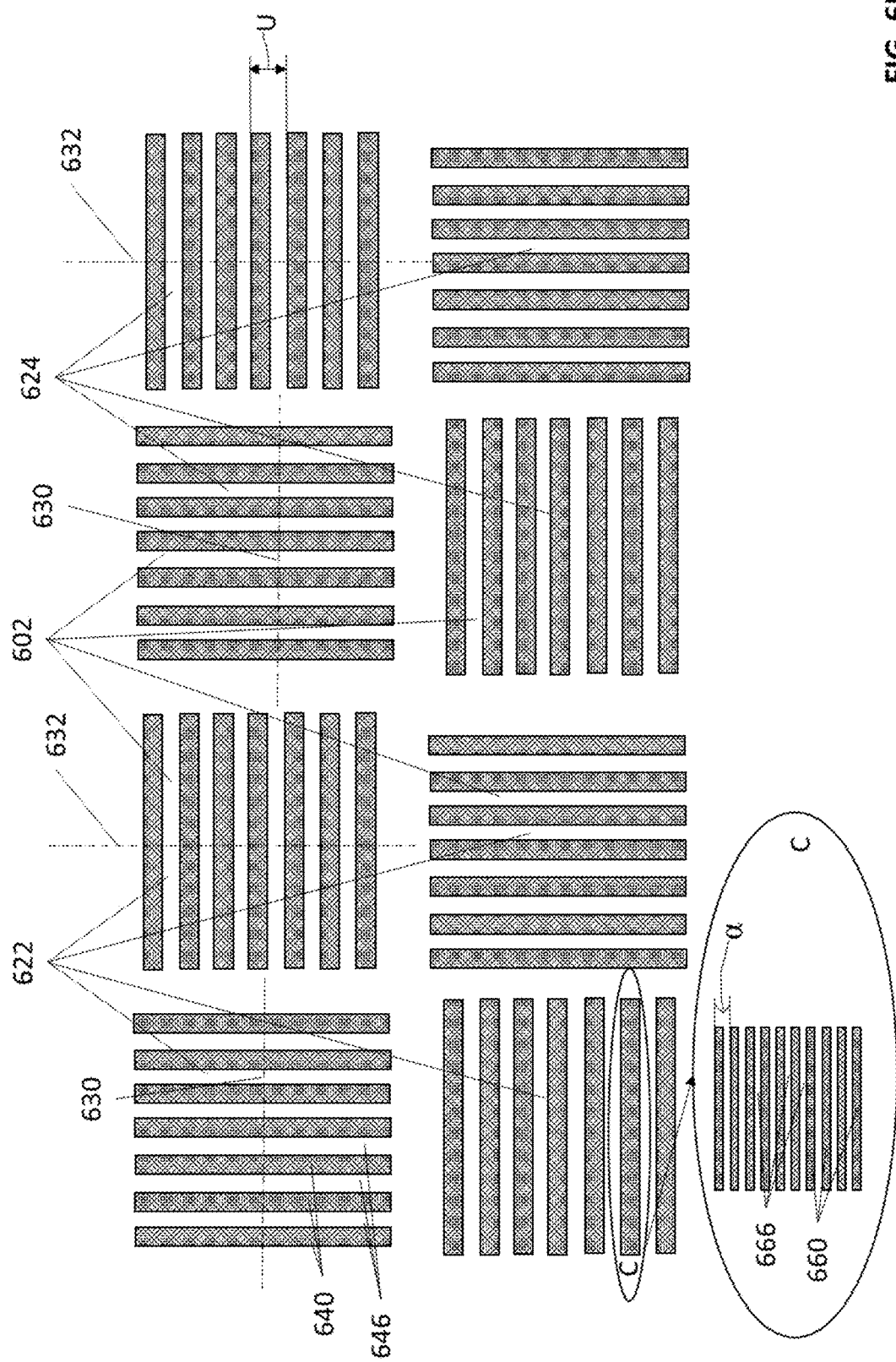

FIGS. 6A-6C illustrate a target 600 preferably having three periodic structures 602, 604 and 606. As seen particularly in sectional enlargements A and B of FIG. 6A, periodic structure 602 is formed on a first layer 610 of a semiconductor device wafer and periodic structures 604 and 606 are both formed on a second layer 620 of the semiconductor device wafer. It is a particular feature of an embodiment of the present invention that periodic structures 604 and 606 are formed simultaneously, using identical fabrication tools and methods. It is appreciated that first and second layers 610 and 620 may be adjacent but need not be.

FIG. 6B illustrates a preferred embodiment of periodic structure 602 forming part of target 600 of FIG. 6A. FIG. 6C illustrates a preferred embodiment of periodic structures 604 and 606 forming part of target 600 of FIG. 6A.

As seen particularly in FIG. 6B, target 600 preferably includes four sets 622 of periodic structures 602 and four sets 624 of periodic structures 602. As seen particularly in FIG. 6C, target 600 preferably includes four sets 626 of periodic structures 604 and four sets 628 of periodic structures 606. As seen particularly in FIG. 6A, sets 626 of periodic structures 604 overlie sets 622 of periodic structures 602, and sets 628 of periodic structures 606 overlie sets 624 of periodic structures 602.

As seen particularly in FIGS. 6B and 6C, in two of each of sets 622, 624, 626 and 628, respective periodic structures 602, 604 or 606 are formed parallel to an axis 630 and in the other two of sets 622, 624, 626 and 628, respective periodic structures 602, 604 or 606 are formed parallel to an axis 632, which is perpendicular to axis 630. Each pair of periodic structures 602 & 604 and 602 & 606 that are parallel to the same axis are distinguished from one another by having a different offset between respective periodic structures 602 & 604 and 602 & 606, each in the range of 10-40 nm. It is appreciated that other than their orientation and offset, each of sets 622, 624, 626 and 628 of periodic structures 602, 604 and 606 are preferably identical to each other.

As seen particularly in FIG. 6B, in a preferred embodiment of the present invention, periodic structure 602 is defined by a plurality of mutually parallel lines 640 and mutually parallel spaces 646 between mutually parallel lines 640. Mutually parallel lines and spaces 640 & 646 are arranged along axes parallel to axes 630 or 632.

As seen in the embodiment illustrated in FIG. 6C, periodic structures 604 and 606 are each defined by a plurality of mutually parallel lines 642 and 644, respectively, and mutually parallel spaces 648 and 650 between respective mutually parallel lines 642 and 644. Mutually parallel lines and spaces 642 & 648 and 644 & 650 are arranged along axes parallel to axes 630 or 632.

Preferably, lines 640, 642 and 646, in periodic structures 602, 604 and 606, have respective pitches U, V and W, each in the range of 300 nm-1 μm and line widths which are 10%-90% of each respective pitch U, V and W, most typically 50% of U, V and W.

Lines 640, 642 and 646, in periodic structures 602, 604 and 606, are typically segmented, though they need not be. In an embodiment wherein lines 640, 642 and 646 are segmented, as seen in enlargement C of FIG. 6B and in enlargements D and E of FIG. 6C, each one of lines 640, 642 and 646 is defined by a plurality of respective sub-lines 660, 662 and 664 and respective sub-spaces 666, 668 and 670 between sub-lines 660, 662 and 664. Preferably, sub-lines 660, 662 and 664 have respective segmentation pitches α, β and γ, each in the range of 10-200 nm.

Periodic structures 602, 604 and 606 may be distinguished from one another by any of their respective pitches U, V and W, their respective line widths and their segmentation pitches α, β and γ, and most preferably their segmentation pitches α, β and γ.

It is a particular feature of an embodiment of the present invention that the first and second instances referenced in the above discussion of FIG. 1 may be misregistration measurements taken using periodic structures 602 & 604 or periodic structures 602 & 606. Correspondingly, the first and second misregistration indications referenced in the above discussion of FIG. 1 may be the misregistration indications obtained from each of the misregistration measurements taken using periodic structures 602 & 604 or periodic structures 602 & 606.

It is appreciated that since periodic structures 604 and 606 are preferably formed together, any difference in misregistration indications between periodic structures 602 & 604 and 602 & 606 over a predetermined threshold indicates a need for amelioration in the misregistration metrology process.

Figure 7A:
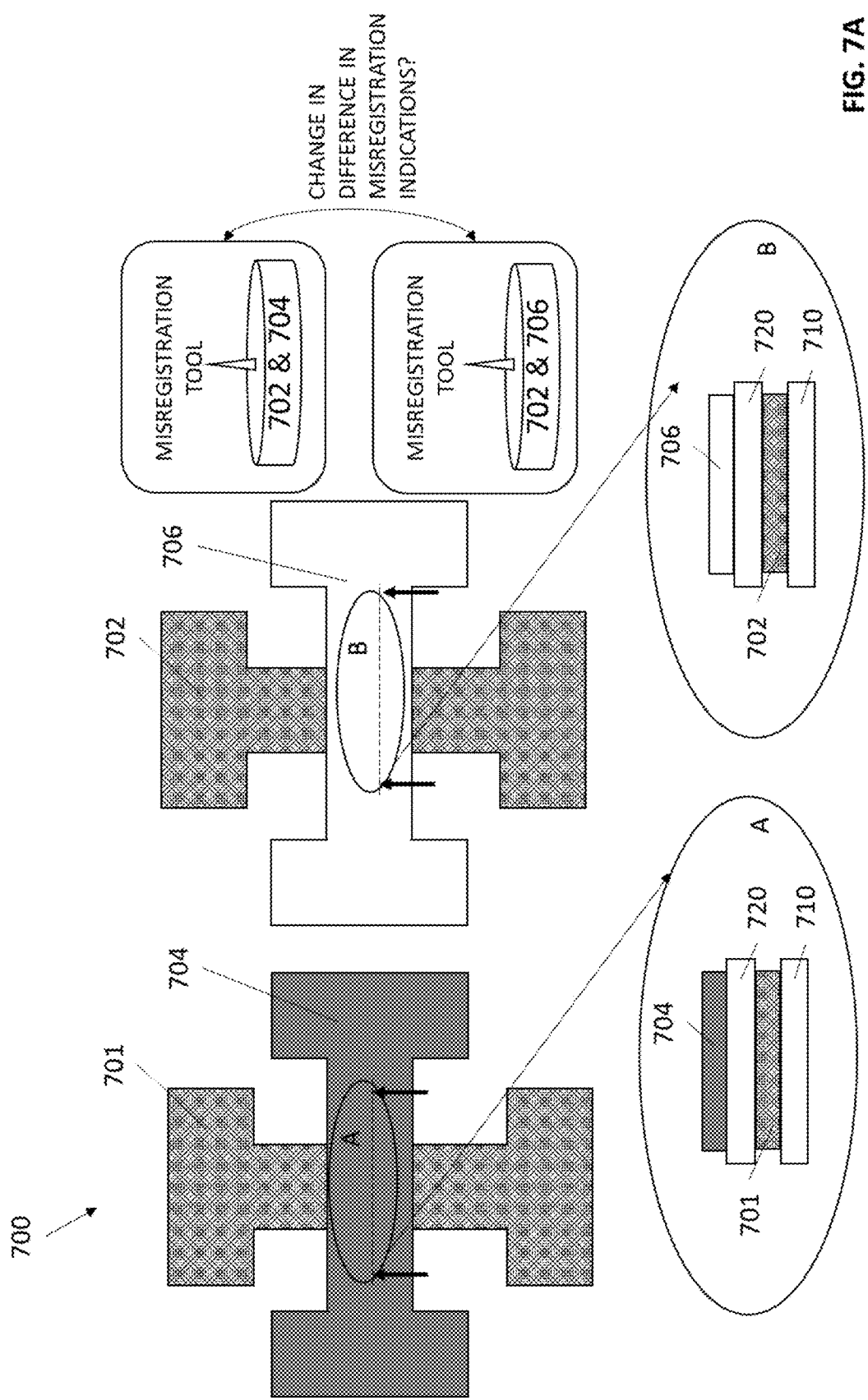
FIGS. 7A and 7B are simplified illustrations of yet another embodiment of the method of FIG. 1 showing multiple instances of measurement of misregistration between two layers of a semiconductor device wafer using different areas of a fifth target.
Figure 7B:
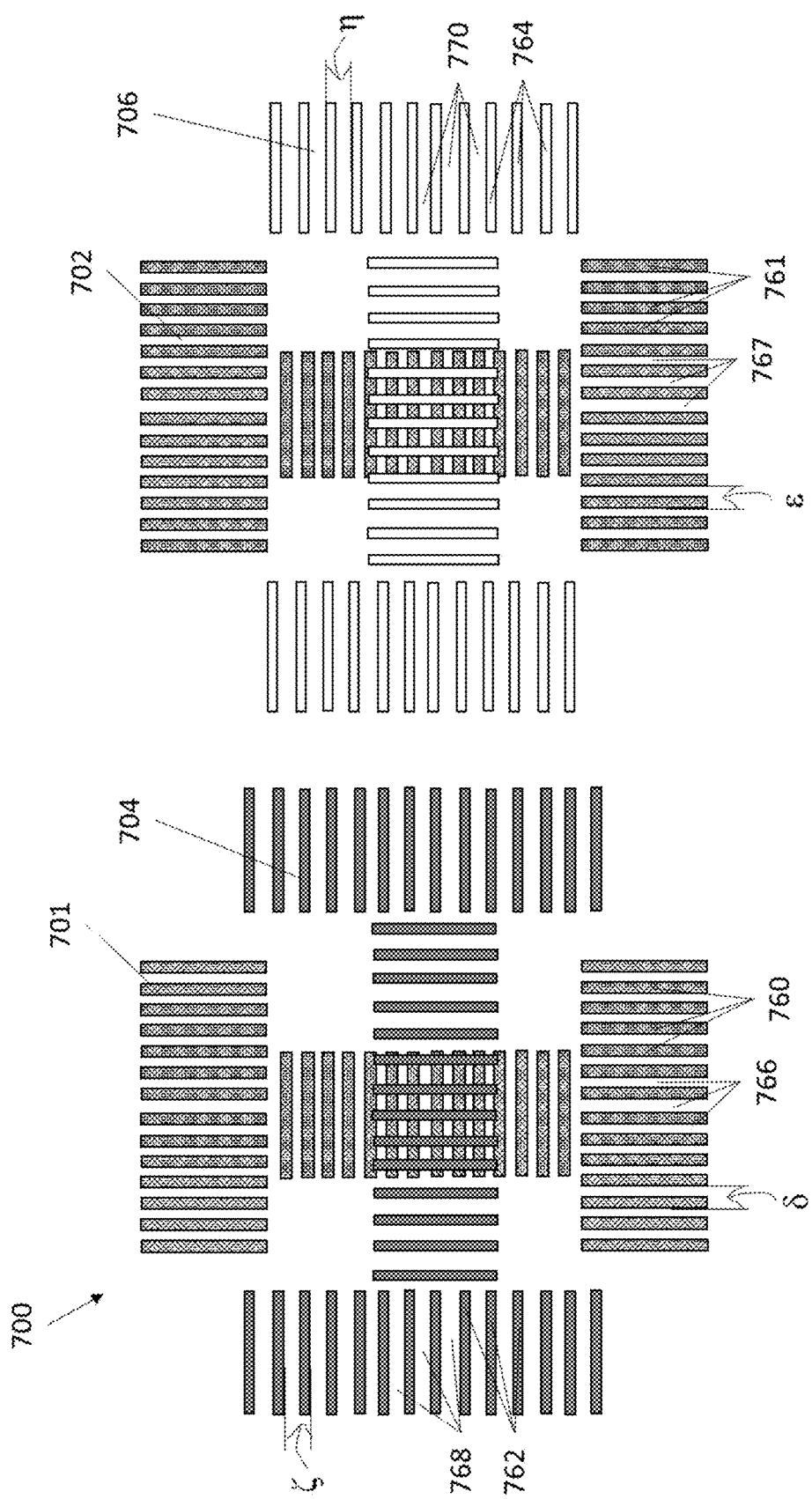

FIGS. 7A & 7B illustrate a target 700 preferably having four structures 701, 702, 704 and 706. As seen particularly in sectional enlargements A and B of FIG. 7A, it is a particular feature of the present invention that structures 701 and 702 are both formed on a first layer 710 of a semiconductor device wafer and structures 704 and 706 are both formed on a second layer 720 of the semiconductor device wafer. It is a particular feature of an embodiment of the present invention that pairs of structures 701 & 702 and 704 & 706 are each formed simultaneously, using identical fabrication tools and methods. It is appreciated that first and second layers 710 and 720 may be adjacent but need not be. It is noted that each of structures 701, 702, 704 and 706 is characterized by rotational symmetry, giving target 700 rotational symmetry.

It is further appreciated that structures 701, 702, 704 and 706 may be any structures characterized by rotational symmetry. It is further appreciated that while target 700 is shown in FIGS. 7A and 7B as having four structures, target 700 may have any even number of structures ranging from 4-20 structures, as long as each pair of structures follows the pattern of 701 & 704 and 702 & 706.

Structures 701, 702, 704 and 706 are typically segmented, though they need not be. In an embodiment wherein structures 701, 702, 704 and 706 are segmented, as seen in enlargement FIG. 7B, each one of structures 701, 702, 704 and 706 is defined by a plurality of respective sub-lines 760, 761, 762 and 764 and respective sub-spaces 766, 767, 768 and 770 between sub-lines 760, 761, 762 and 764. Preferably, sub-lines 760, 761, 762 and 764 have respective segmentation pitches $\delta$, $\epsilon$, $\zeta$ and $\eta$, each in the range of 10-200 nm. Structures 701, 702, 704 and 706 are preferably distinguished from one another by any of their respective segmentation pitches $\delta$, $\epsilon$, $\zeta$, and $\eta$.

It is a particular feature of an embodiment of the present invention that the first and second instances referenced in the above discussion of FIG. 1 may be misregistration measurements taken using structures 701 & 704 or structures 702 & 706. Correspondingly, the first and second misregistration indications referenced in the above discussion of FIG. 1 may be the misregistration indications obtained from each of the misregistration measurements taken using structures 701 & 704 or structures 702 & 706.

It is appreciated that since each of pairs of structures 701 & 702 and 704 & 706 are preferably each formed together, any difference in misregistration indications between structures 701 & 704 and 702 & 706 over a predetermined threshold indicates a need for amelioration in the misregistration metrology process.

Figure 8:
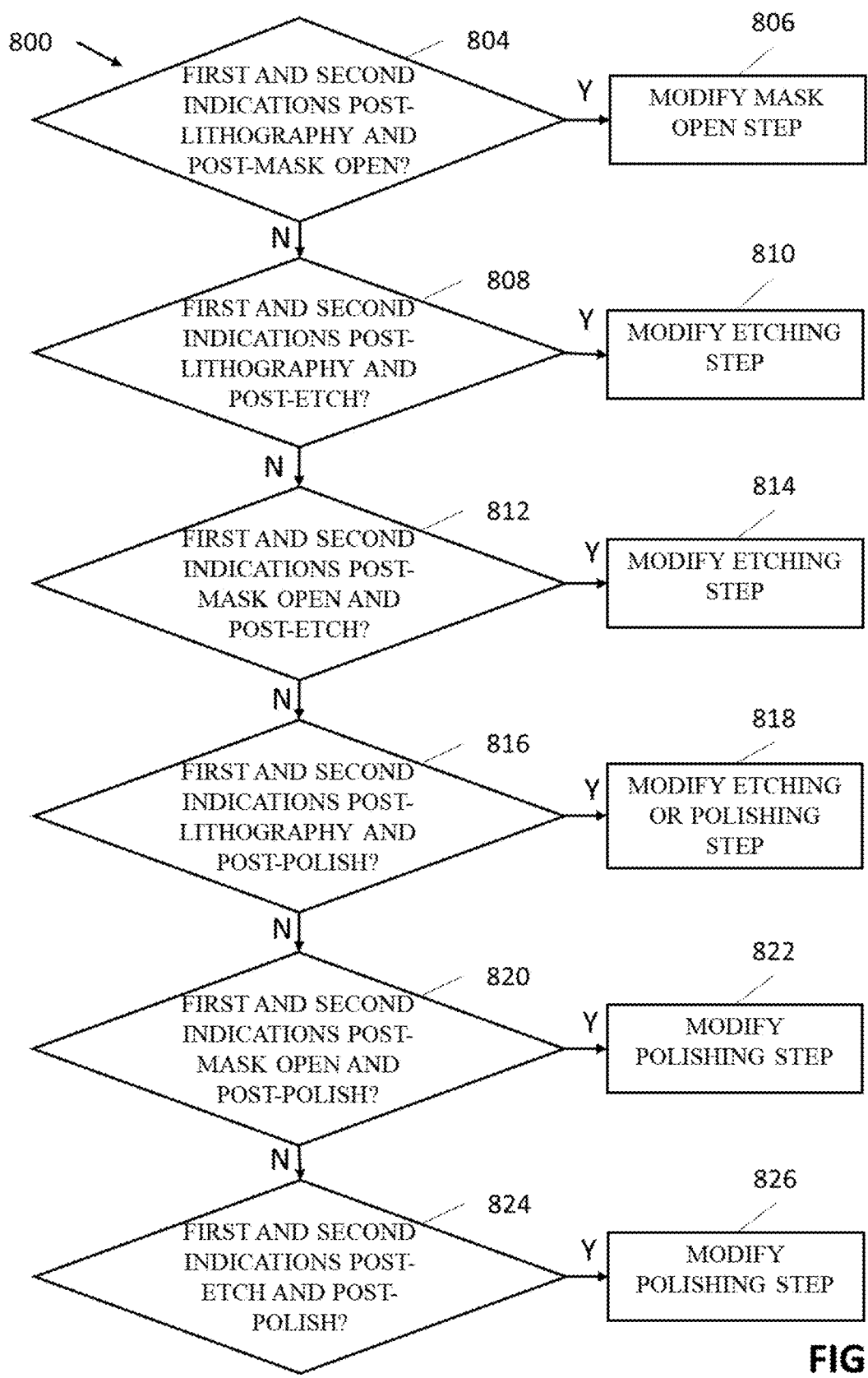
FIG. 8 is a simplified flowchart illustrating amelioration of measured misregistration by modifying parameters of a manufacturing process of the semiconductor device wafer.

Reference is now made to FIG. 8, which is a simplified flowchart illustrating an amelioration method 800 of measured misregistration by modifying parameters of a manufacturing process of the semiconductor device wafer, useful in conjunction with the method described hereinabove with reference to FIGS. 1-2.

It is appreciated that method 800, described hereinbelow, is performed as part of step 150, of the method described in FIG. 1, to determine which stage of the process described in FIG. 2 requires amelioration.

As seen at a first step 804, method 800 ascertains if the first and second misregistration indications are post-lithography misregistration indication 252 and post-mask open misregistration indication 254.

If the first and second misregistration indications are post-lithography misregistration indication 252 and post-mask open misregistration indication 254, method 800 proceeds to next step 806 whereat mask opening stage 204 is modified in preparation of processing of further semiconductor device wafers. For example, etching depth of the mask opening stage may be modified or material properties such as index of refraction or dielectric constant of the layers measured may be modified.

If the first and second misregistration indications are not post-lithography misregistration indication 252 and post-mask open misregistration indication 254, method 800 proceeds to a next step 808 at which method 800 ascertains if the first and second misregistration indications are post-lithography misregistration indication 252 and post-etch misregistration indication 256.

If the first and second misregistration indications are post-lithography misregistration indication 252 and post-etch misregistration indication 256, method 800 proceeds to next step 810 whereat etching stage 206 is modified in preparation of processing of further semiconductor device wafers. For example, etching time may be modified or material properties such as index of refraction or dielectric constant of the layers measured may be modified.

If the first and second misregistration indications are not post-lithography misregistration indication 252 and post-etch misregistration indication 256, method 800 proceeds to a next step 812 at which method 800 ascertains if the first and second misregistration indications are post-mask open misregistration indication 254 and post-etch misregistration indication 256.

If the first and second misregistration indications are post-mask open misregistration indication 254 and post-etch misregistration indication 256, method 800 proceeds to next step 814 whereat etching stage 206 is modified in preparation of processing of further semiconductor device wafers. For example, etching time may be modified or material properties such as index of refraction or dielectric constant of the layers measured may be modified.

If the first and second misregistration indications are not post-mask open misregistration indication 254 and post-etch misregistration indication 256, method 800 proceeds to a next step 816 at which method 800 ascertains if the first and second misregistration indications are post-lithography misregistration indication 252 and post-polish misregistration indication 258.

If the first and second misregistration indications are post-lithography misregistration indication 252 and post-polish misregistration indication 258, method 800 proceeds to next step 818 whereat at least one of etching stage 206 and polishing stage 208 is modified in preparation of processing of further semiconductor device wafers. For example, any of etching time, polish time, polish angle and materials used in the polishing stage may be adjusted or material properties such as index of refraction or dielectric constant of the layers measured may be modified.

If the first and second misregistration indications are not post-lithography misregistration indication 252 and post-polish misregistration indication 258, method 800 proceeds to a next step 820 at which method 800 ascertains if the first and second misregistration indications are post-mask open misregistration indication 254 and post-polish misregistration indication 258.

If the first and second misregistration indications are post-mask open misregistration indication 254 and post-polish misregistration indication 258, method 800 proceeds to next step 822 whereat polishing stage 208 is modified in preparation of processing of further semiconductor device wafers. For example, any of polish time, polish angle and materials used in the polishing stage may be adjusted or material properties such as index of refraction or dielectric constant of the layers measured may be modified.

If the first and second misregistration indications are not post-mask open misregistration indication 254 and post-polish misregistration indication 258, method 800 proceeds to a next step 824 at which method 800 ascertains if the first and second misregistration indications are post-etch misregistration indication 256 and post-polish misregistration indication 258.

If the first and second misregistration indications are post-etch misregistration indication 256 and post-polish misregistration indication 258, method 800 proceeds to a next step 826 whereat polishing stage 208 is modified in preparation of processing of further semiconductor device wafers. For example, any of polish time, polish angle and materials used in the polishing stage may be adjusted or material properties such as index of refraction or dielectric constant of the layers measured may be modified.

Figure 9A:
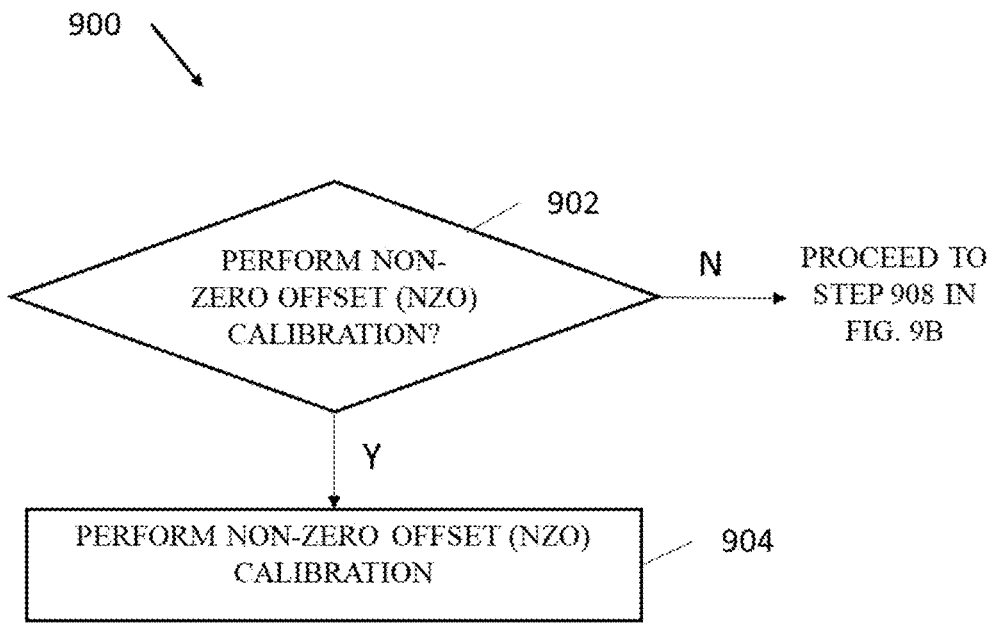
FIGS. 9A and 9B are together a simplified flowchart illustrating amelioration of measured misregistration by modifying metrology parameters related to measurement of misregistration between layers of the semiconductor device wafer.
Figure 9B:
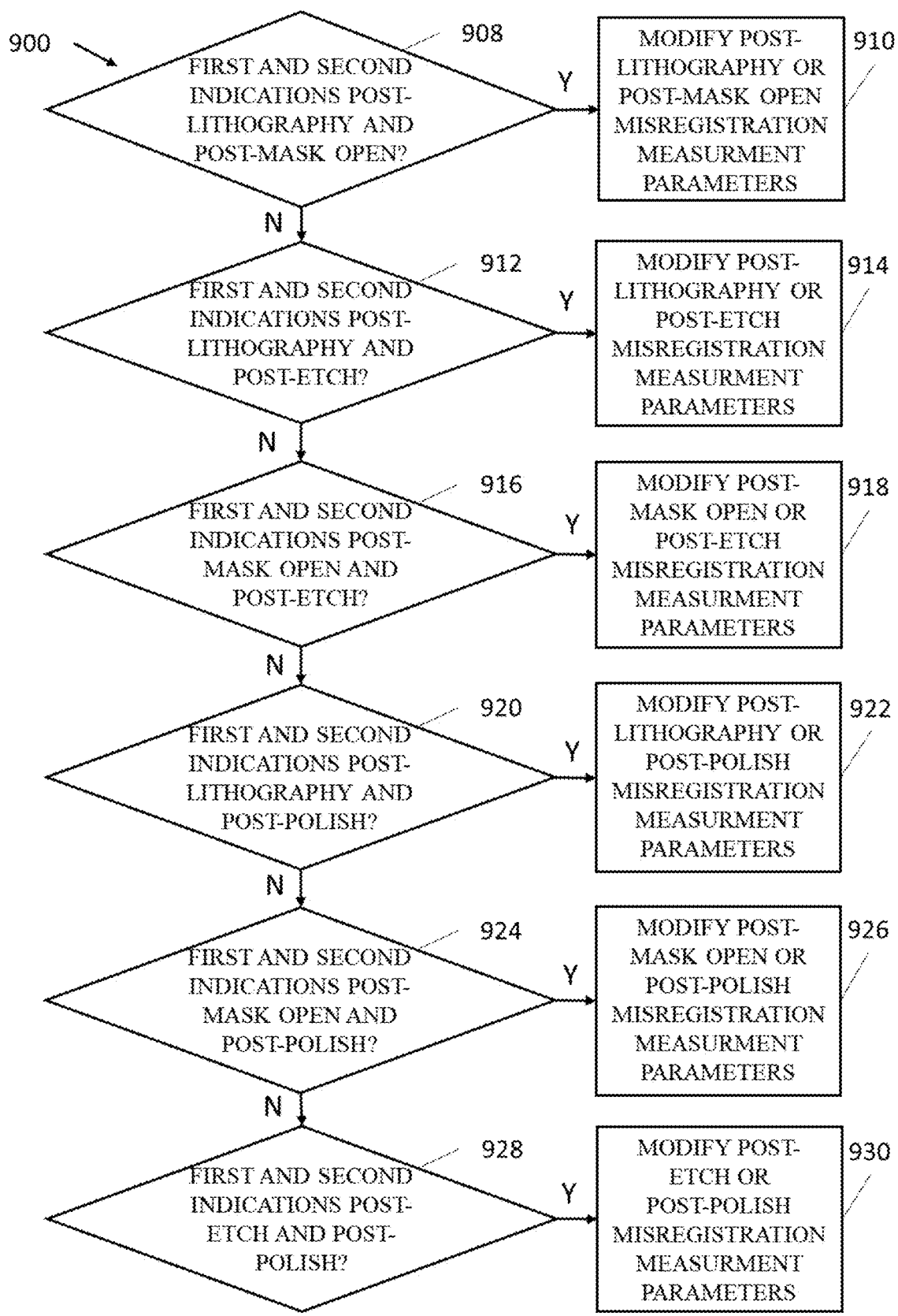

Reference is now made to FIGS. 9A & 9B, which together are a simplified flowchart illustrating an amelioration method 900 of measured misregistration by modifying metrology parameters related to measurement of misregistration between layers of the semiconductor device wafer, useful in conjunction with the method described hereinabove with reference to FIGS. 1-7.

It is appreciated that method 900, described below, is performed as part of step 150, of the method described in FIG. 1, to determine which metrology parameters require amelioration, as an alternative to method 800. In a preferred embodiment of the present invention, method 900 is performed if other metrics, such as an acceptable Q-merit value or a high tool-induced-shift, indicate that there may be a problem with misregistration metrology measurements.

As seen at a first step 902, method 900 ascertains if non-zero offset (NZO) calibration should be performed. If NZO calibration should be performed, for example, in embodiments described hereinabove with reference to FIGS. 3-7, method 900 continues to a next step 904 at which NZO calibration is performed.

If NZO calibration should not be performed, method 900 proceeds to a next step 908, wherein method 900 ascertains if the first and second misregistration indications are post-lithography misregistration indication 252 and post-mask open misregistration indication 254.

If the first and second misregistration indications are post-lithography misregistration indication 252 and post-mask open misregistration indication 254, method 900 proceeds to next step 910 whereat at least one of post-lithography and post-mask open misregistration measurement parameters are modified.

For example, region of interest at which misregistration is measured, wavelength of light utilized in misregistration measurement, polarization of light utilized in misregistration measurement, numerical aperture, diffraction mask and diffraction aperture may be adjusted to reduce the difference between post-lithography misregistration indication 252 and post-mask open misregistration indication 254. As an additional example, outlying measurement results may be identified and removed from misregistration measured at at least one of post-lithography and post-mask open misregistration measurements.

If the first and second misregistration indications are not post-lithography misregistration indication 252 and post-mask open misregistration indication 254, method 900 proceeds to a next step 912 at which method 900 ascertains if the first and second misregistration indications are post-lithography misregistration indication 252 and post-etch misregistration indication 256.

If the first and second misregistration indications are post-lithography misregistration indication 252 and post-etch misregistration indication 256, method 900 proceeds to next step 914 whereat at least one of post-lithography and post-etch misregistration measurement parameters are modified.

For example, region of interest at which misregistration is measured, wavelength of light utilized in misregistration measurement, polarization of light utilized in misregistration measurement, numerical aperture, diffraction mask and diffraction aperture may be adjusted to reduce the difference between post-lithography misregistration indication 252 and post-etch misregistration indication 256. As an additional example, outlying measurement results may be identified and removed from misregistration measured at at least one of post-lithography and post-etch misregistration measurements.

If the first and second misregistration indications are not post-lithography misregistration indication 252 and post-etch misregistration indication 256, method 900 proceeds to a next step 916 at which method 900 ascertains if the first and second misregistration indications are post-mask open misregistration indication 254 and post-etch misregistration indication 256.

If the first and second misregistration indications are post-mask open misregistration indication 254 and post-etch misregistration indication 256, method 900 proceeds to next step 918 whereat at least one of post-mask open and post-etch misregistration measurement parameters are modified.

For example, region of interest at which misregistration is measured, wavelength of light utilized in misregistration measurement, polarization of light utilized in misregistration measurement, numerical aperture, diffraction mask and diffraction aperture may be adjusted to reduce the difference between post-mask open misregistration indication 254 and post-etch misregistration indication 256. As an additional example, outlying measurement results may be identified and removed from misregistration measured at at least one of post-mask open and post-etch misregistration measurements.

If the first and second misregistration indications are not post-mask open misregistration indication 254 and post-etch misregistration indication 256, method 900 proceeds to a next step 920 at which method 900 ascertains if the first and second misregistration indications are post-lithography misregistration indication 252 and post-polish misregistration indication 258.

If the first and second misregistration indications are post-lithography misregistration indication 252 and post-polish misregistration indication 258, method 900 proceeds to next step 922 whereat at least one of post-lithography and post-polish misregistration measurement parameters are modified.

For example, region of interest at which misregistration is measured, wavelength of light utilized in misregistration measurement, polarization of light utilized in misregistration measurement, numerical aperture, diffraction mask and diffraction aperture may be adjusted to reduce the difference between post-lithography misregistration indication 252 and post-polish misregistration indication 258. As an additional example, outlying measurement results may be identified and removed from misregistration measured at at least one of post-lithography and post-polish misregistration measurements.

If the first and second misregistration indications are not post-lithography misregistration indication 252 and post-polish misregistration indication 258, method 900 proceeds to a next step 924 at which method 900 ascertains if the first and second misregistration indications are post-mask open misregistration indication 254 and post-polish misregistration indication 258.

If the first and second misregistration indications are post-mask open misregistration indication 254 and post-polish misregistration indication 258, method 900 proceeds to next step 926 whereat at least one of post-mask open and post-polish misregistration measurement parameters are modified.

For example, region of interest at which misregistration is measured, wavelength of light utilized in misregistration measurement, polarization of light utilized in misregistration measurement, numerical aperture, diffraction mask and diffraction aperture may be adjusted to reduce the difference between post-mask open misregistration indication 254 and post-polish misregistration indication 258. As an additional example, outlying measurement results may be identified and removed from misregistration measured at at least one of post-mask open and post-polish misregistration measurements.

If the first and second misregistration indications are not post-mask open misregistration indication 254 and post-polish misregistration indication 258, method 900 proceeds to a next step 928 at which method 900 ascertains if the first and second misregistration indications are post-etch misregistration indication 256 and post-polish misregistration indication 258.

If the first and second misregistration indications are post-etch misregistration indication 256 and post-polish misregistration indication 258, method 900 proceeds to a next step 930 whereat at least one of post-etch and post-polish misregistration measurement parameters are modified.

For example, region of interest at which misregistration is measured, wavelength of light utilized in misregistration measurement, polarization of light utilized in misregistration measurement, numerical aperture, diffraction mask and diffraction aperture may be adjusted to reduce the difference between post-etch misregistration indication 256 and post-polish misregistration indication 258. As an additional example, outlying measurement results may be identified and removed from misregistration measured at at least one of post-etch and post-polish misregistration measurements.

It will be appreciated by persons skilled in the art that the present invention is not limited to what has been particularly shown and described hereinabove. The scope of the present invention includes both combinations and subcombinations of various features described hereinabove as well as modifications thereof, all of which are not in the prior art.

The invention claimed is:

1. A target for use in measurement of misregistration in the manufacture of semiconductor device wafers and in the calibration of said measurements of misregistration, said target comprising:

at least a first structure arranged on a first layer of a semiconductor device wafer; and at least a second and a third different structures arranged on a second layer of said semiconductor device, wherein the second different structure and the third different structure have different line widths and pitches, wherein said second and third different structures are formed simultaneously using identical fabrication tools and methods, and wherein a difference in misregistration indications between the first structure and the second different structure and between the first structure and the third different structure represent a need for amelioration in the measurement of misregistration.

2. The target of claim 1, wherein at least one of said first, second and third different structures is defined by a plurality of sub-lines and sub-spaces between said sub-lines, said sub-lines having a pitch.

3. The target of claim 2, wherein:

said second structure is defined by a plurality of second structure sub-lines and a plurality of second different structure sub-spaces having a second structure pitch;

said third structure is defined by a plurality of third structure sub-lines and a plurality of third different structure sub-spaces having a third structure pitch; and said second structure pitch and said third structure pitch are different from one another.

4. The target of claim 1, wherein said target has rotational symmetry.

5. The target of claim 1, wherein said first, second and third different structures are periodic structures.

6. The target of claim 5, wherein said second and third different structures overlie said first periodic structure.

7. The target of claim 1, wherein said first structure, second different structure, and third different structure are bars or rectangular boxes.

8. The target of claim 1, further comprising at least a fourth structure and wherein said first structure, second different structure, third different structure, and fourth structure have rotational symmetry.

9. The target of claim 1, wherein the first layer and the second layer are adjacent.

10. The target of claim 1, wherein the first structure, the second different structure, and the third different structure have different mutually orthogonal orientations.

11. The target of claim 1, wherein the first structure, the second different structure, and the third different structure include a plurality of mutually parallel lines.

12. The target of claim 11, wherein the lines mutually parallel lines are each segmented into sub-lines.

13. The target of claim 12, wherein the sub-lines have a segmentation pitch from 10 nm to 200 nm.

14. The target of claim 1, wherein the line widths of the first structure, the second different structure, and the third different structure are from 10% to 90% of the pitch of the first structure, the second different structure, and the third different structure, respectively.

* * * * *